United States Patent
Bourdelle et al.

[11] Patent Number: 6,136,672
[45] Date of Patent: Oct. 24, 2000

[54] PROCESS FOR DEVICE FABRICATION USING A HIGH-ENERGY BORON IMPLANT

[75] Inventors: Konstantin K. Bourdelle, Orlando, Fla.; David James Eaglesham, Hoboken, N.J.

[73] Assignee: Lucent Technologies Inc., Murray Hill, N.J.

[21] Appl. No.: 09/131,860

[22] Filed: Aug. 10, 1998

Related U.S. Application Data

[60] Provisional application No. 60/082,076, Apr. 17, 1998.

[51] Int. Cl.$^7$ .................................................. H01L 21/425
[52] U.S. Cl. ........................ 438/530; 438/514; 438/522; 438/510
[58] Field of Search .................................... 438/514, 530, 438/522, 533, 659, 510, 518

[56] References Cited

U.S. PATENT DOCUMENTS

| | | | |
|---|---|---|---|
| 4,456,489 | 6/1984 | Wu | 148/1.5 |
| 4,584,026 | 4/1986 | Wu et al. | 148/1.5 |
| 5,399,506 | 3/1995 | Tsukamoto | 437/19 |

OTHER PUBLICATIONS

"Anonmalous Leakage Current Reduction by Ramping Rate Control in MEV Impantation", by Hamada, K. et al. *Mat. Res. Symp. Proc.*, vol. 396, pp. 739–743 (1996).

"High Energy Ion Implantation for ULSI: Well Engineering and Gettering", by Tsukamoto, K. et al., *Solid state Technology*, pp. 49–51 (Jun. 1992).

"High–Energy Ion Implantation for ULSI", by Tsukamoto, K. et al., *Nuclear Instruments and Methods in Physics–Research*, B59/60, pp. 584–591 (1991).

"Formation of Extended Defects in Silicon by High Energy Implantation of B and P", by Cheng, J. Y. et al., *J. Appl. Phys.*, 80 (4), pp. 2105–2112 (Aug. 15, 1996).

"Bipolar Transistor with a Buried Layer Formed yb High–Energy Ion Implantation for Subhalf–Micron Bipolar––Complementary Metal Oxide Semiconductor LSIs", by Kuroi, T. et al., *Japan J. Appl. Phys.*, 33, pp. 541–545 (1994).

S. Wolf and R. N. Tauber, Silicon Processing for the VLSI Era. vol. 1, Chapter 9, Aug. 1986.

J. P. Cheng et al., Formation of extended defects in silicon by high energy implantation of B and P, Appl Phys, 80 (4), Aug. 1986.

*Primary Examiner*—Matthew Smith
*Assistant Examiner*—Belur V Keshavan
*Attorney, Agent, or Firm*—Richard J. Botos

[57] ABSTRACT

A process for semiconductor device fabrication in which a Czochralski silicon substrate is implanted with boron is disclosed. The boron is implanted using an energy of about 500 keV to about 3 MeV and a dose of about $3\times10^{13}/cm^2$ to about $3\times10^{14}/cm^2$. In order to reduce the threading dislocation density in the substrate to less than about $10^3/cm^2$ at a depth in the substrate of at least about 0.5 $\mu$m, after the implant, the substrate is annealed in a two-step process. First the substrate is annealed at a temperature in the range of about 725° C. to about 775° C. followed by an anneal at a temperature of at least about 900° C. The duration of the first step is selected to provide a dislocation density of less than about $10^3/cm^2$ at the desired depth in the substrate.

4 Claims, 1 Drawing Sheet

PROCESS FOR DEVICE FABRICATION USING A HIGH-ENERGY BORON IMPLANT

CROSS-REFERENCE TO RELATED APPLICATION

This application claims priority of Provisional application Ser. No. 60/082076 which was filed Apr. 17, 1998.

BACKGROUND OF THE INVENTION

1. Technical Field

The present invention is directed to a process for semiconductor, and, specifically to a technique for introducing boron dopant into a semiconductor substrate.

2. Art Background

In integrated circuit fabrication, dopants are frequently introduced into semiconductor substrates to provide the semiconductor substrate with certain electrical characteristics. High energy implants (i.e. implants using an implant energy in excess of about 0.5 MeV) are an increasingly important method for introducing dopants into semiconductor substrates because the dopants and/or defects are implanted to the desired depth (i.e. about 0.5 $\mu$m to about 5 $\mu$m) beneath the surface of the substrate. High energy implants are used for forming retrograde wells for complementary metal-oxide semiconductor (CMOS), latch up immunity improvement, buried layers for soft-error reduction in dynamic random access memories, bipolar subcollectors, and proximity gettering centers. At these high energies, the dopant profile is tailored to provide the desired concentration of dopant within the desired distance from the surface of the semiconductor substrate. As noted in Kuroi, T., et al., "Bipolar Transistor with a Buried Layer Formed by High-Energy Ion Implantation for Subhalf-Micron Bipolar Complementary Metal Oxide Semiconductor LSIs," *Jpn. J. Appl. Phys.*, Vol. 33 Pt. 1, No. 1B (1994) high energy implants are useful because the buried layer (i.e. the region of the substrate below the surface with a dopant concentration above a certain threshold amount) is formed without growing an epitaxial layer on the semiconductor substrate to place the buried layer at the desired depth below the substrate surface. In Kuroi et al., the buried layer is formed using a phosphorous ion implant at 1.5 MeV with doses ranging from $1\times10^{13}/cm^2$ to $1\times10^{15}/cm^2$, followed by an anneal. The anneal conditions described in Kuroi et al. are either a furnace anneal at 1000° C. for 1 hour, or a rapid thermal anneal at 1000° C. for 30 seconds in a nitrogen atmosphere. However, Kuroi et al. note that the damage caused by such high energy implants, and the high leakage currents that result therefrom must be reduced.

Cheng, J. Y., et. al., "Formation of extended defects in silicon by high energy implantation of B and P" *J. Appl. Phys. Vol.* 80, No. 4, pp. 2105–2112 (August 1996) observe the effects of high energy boron (1.5 MeV) and phosphorus (2.6 MeV) implants in silicon. Cheng et al. observe the formation of long dislocation dipoles (referred to as threading dislocations) after a furnace anneal of the implanted substrates. These dislocations were generated in the substrate at the approximate depth of the mean projected range of the implanted ions. The dislocations were observed to grow up to the substrate surface and were found to cause high junction leakage current. Cheng et al. investigated the dislocation density as a function of the dopant (boron or phosphorous), implant dose, depth, and the substrate (Czochralski (Cz) substrates, float zone (FZ) grown (100) Si substrates, and epitaxial silicon layers grown on (100) silicon (epi) substrates).

According to Cheng et al., the threading dislocation density caused by high energy boron implant is much higher in Czochralski substrates than in the other types of substrates after a post implant anneal at 900° C. for 30 minutes. Cheng et al. showed that the dislocation density has strong dose dependence, with a maximum defect density observed at doses of about $1\times10^{14}/cm^2$. The density of threading dislocations was found to increase with increasing distance from the surface. Cheng et al. proposed a two step anneal wherein the substrate is first annealed at 700° C. for about 20 hours followed by an anneal at 900° C. to reduce the formation of threading dislocation during the 900° C. anneal. Cheng et al. observed that the two-step anneal reduced the density of threading dislocations in boron-implanted Czochralski substrates and boron-implanted epitaxial silicon substrates.

However, the 20 hour anneal suggested by Cheng et al. is simply too long to be practical in commercial processes for semiconductor processing. Consequently, processes that reduce the threading dislocations caused by high energy implants and that are compatible with commercial processes for device fabrication are sought.

SUMMARY OF THE INVENTION

The present invention is a process for device fabrication in which boron is implanted into a Czochralski (Cz) silicon substrate. Cz silicon substrates have a higher oxygen content than other silicon substrates. Typically, Cz silicon substrates have an oxygen content on the order of about $1\times10^{17}$ to about $2\times10^{18}$ atoms/cm$^3$. The boron implant is a high energy implant. For purposes of the present invention, a high energy implant is an implant with an energy of at least about 500 keV. It is advantageous if the implant energy is in the range of about 500 keV to about 3 MeV. The implant dose is in the range of about $1\times10^{13}$ atoms/cm$^2$ to about $5\times10^{14}$ atoms/cm$^2$. It is advantageous if the implant dose is in the range of about $3\times10^{13}$ atoms/cm$^2$ to about $3\times10^{14}$ atoms/cm$^2$. After implantation, the substrate is annealed at a first temperature followed by an anneal at a second temperature. The first temperature is in the range of about 700° C. to about 800° C. It is advantageous if the first temperature is in the range of about 725° C. to about 775° C. The second temperature is at least about 900° C. The duration of the first anneal is less than about 5 hours. It is advantageous if the duration of the anneal is thirty minutes or less. The duration and temperature of the first anneal is selected so that the threading dislocation density in the substrate regions that will become the active areas of the device is less than about $10^3/cm^2$.

In the context of the present invention, the active area of the device is the device junction. For example, in CMOS (Complementary Metal Oxide Semiconductor) devices, the junction includes the source, drain, and channel. The depth of the active region is related to the size of the device. That is, for example, in a 0.35 $\mu$m device the depth of the source, drain, and channel regions in the substrate is in the range of about 0.2 μm to about 0.3 μm. The prescription of a maximum dislocation density is a prescription that no more than about the specified maximum dislocations be present in these active areas. This does not preclude the presence of dislocations in the substrate above the specified maximum in regions of the substrate that are below the active regions. In fact, it is expected that devices made according to the process of the present invention will have a dislocation density higher than the specified maximum in regions of the substrate below the active regions of the device.

DETAILED DESCRIPTION

Figure 1:
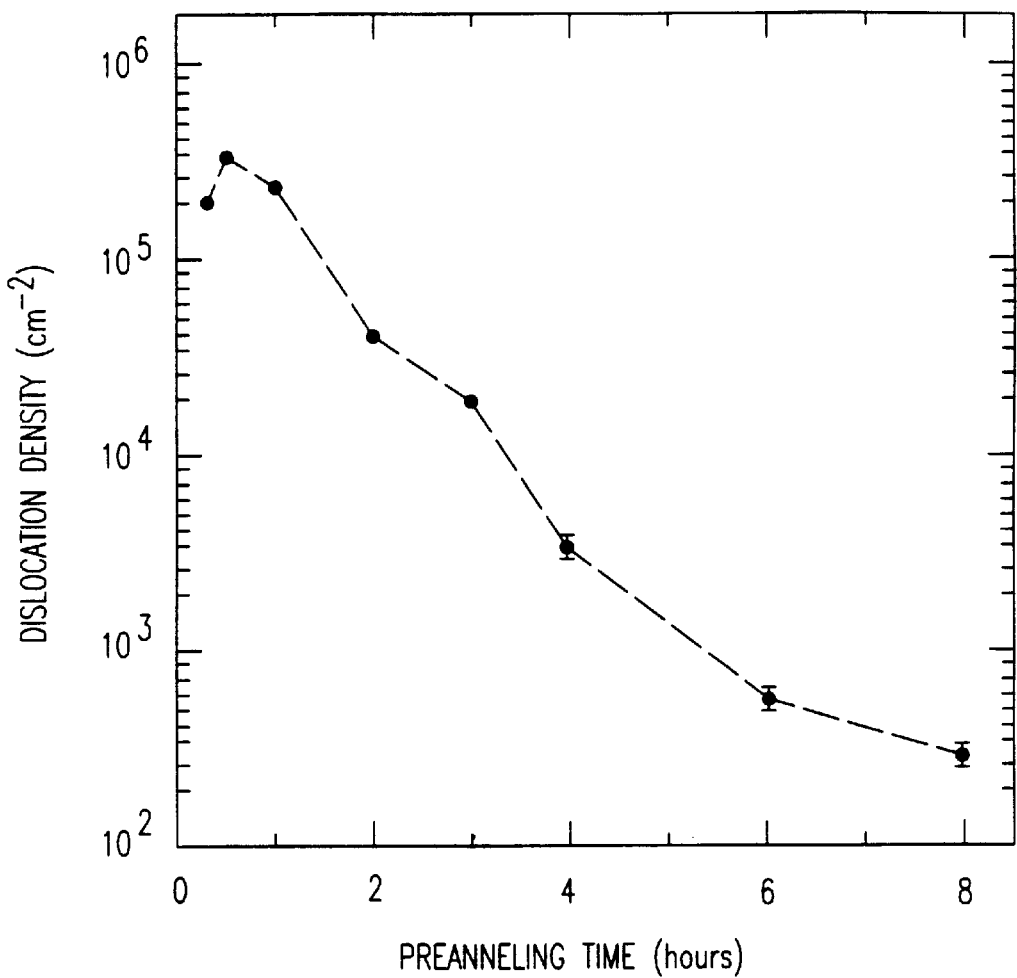
FIG. 1 illustrates the relationship between the threading dislocation density of a Cz substrate doped with boron using a high energy implant and the duration of the first anneal.

In the process of the present invention a Cz silicon substrate is doped with boron using a high energy implant. The boron implant conditions of the present invention are an implant energy in the range of about 500 keV to about 3 MeV and an implant dose of about $1 \times 10^{13}$ atoms /cm$^2$ to about $5 \times 10^{14}$ atoms/cm$^2$. It is advantageous if the implant dose is in the range of about $3 \times 10^{13}$ atoms/cm$^2$ to about $3 \times 10^{14}$ atoms/cm$^2$. After the implant, the substrate is subjected to a two-step anneal in order to control the density of the threading dislocations in the substrate. In the first step, the substrate is heated to a temperature of about 725° C. to about 775° C. The duration of the first step is selected to provide a substrate in which the threading dislocation density is less than about $10^3$/cm$^2$ in the active regions of the device. It is advantageous if the duration of the first step is less than 30 minutes.

In the second step of the anneal, the temperature is at least about 900° C. It is advantageous if the duration of the second annealing step is about 30 minutes or less. The substrate is annealed in a conventional annealing atmosphere such as N$_2$ or in a vacuum. After the substrate is annealed, devices are formed on the substrate using conventional processing techniques well known to one skilled in the art.

The process of the present invention is useful when a high energy boron implant is required to fabricate a desired semiconductor devices. High energy boron implants are used to fabricate a variety of semiconductor devices. The use of high energy ion implantation for engineering a profiled well in CMOS devices is described in Tsukamoto, K., et al., "High Energy Ion Implantation for ULSI: Well Engineering and Gettering," *Solid State Technology*, (June 1992) which is hereby incorporated by reference. For example, retrograde wells for CMOS latch-up immunity improvement are formed by introducing boron dopant into the substrate using the above- described high energy implant conditions. The desired distribution of the dopant in the substrate is then obtained using the two-step anneal of the present invention. Conventional processing techniques are then employed to complete the CMOS device.

Buried layers for soft-error reduction in dynamic random access memories (DRAMs) are also formed introducing boron dopant into the substrate using the above-described implant conditions followed by the two step anneal of the present invention. After the boron is implanted into the substrate and distributed according to the process of the present invention, conventional processing steps are used to complete the DRAMs.

Bipolar subcollectors are also formed by implanting boron dopant into the substrate using the above-described implant conditions followed by the two step anneal of the present invention. After the boron is implanted into the substrate and distributed according to the process of the present invention, conventional processing steps are used to complete the bipolar devices.

The high energy boron implant/two-step anneal of the present invention is also used to form gettering layers in a variety of semiconductor devices. After the gettering layer is formed according to the process of the present invention, conventional processing steps are used to complete the devices.

EXAMPLE 1

A variety of different single crystal silicon substrates were implanted with boron using an implantation energy of 1.9 MeV and a dose of $1 \times 10^{14}$ atoms/cm$^2$. The silicon substrates so implanted were Cz substrates, low oxygen Cz (low-O Cz) substrates (oxygen content in the range of about $1 \times 10^{17}$ atoms/cm$^3$ to about $7 \times 10^{17}$ atoms/cm$^3$), float-zone (FZ) silicon substrates, and silicon substrates with a 7 μm-thick epitaxial layer (epi substrates) of silicon formed thereon.

The effect of annealing time on the threading dislocation density of the implanted low-oxygen Cz substrates was observed. A two-step anneal (675° C. ±25° C. first step, 900° C. second step) was performed. These annealing conditions were suggested in the previously cited Cheng et al. reference. After the two step anneal, a Schimmel etch was used to delineate threading dislocations in the near-surface region (up to one micrometer) of the substrate. The Schimmel etch is described in Schimmel, D. G., *J. Electrochem. Soc.*, Vol 126, p. 149 (1979), which is hereby incorporated by reference. The depth of the Schimmel etch was about 0.8 μm. Consequently, the depth in the substrate at which the dislocation density was measured was about 0.8 μm. This is considerably greater than the depth of the active areas of devices having a size of about 0.5 μm or less. The density of the dislocation etch pits was measured using a Nomarski microscope at 1000× magnification. The duration of the first step was varied, and the threading dislocation density was plotted as a function of the duration of the first annealing step. The duration of the 900° C. annealing step was 30 minutes for all the anneals. The relationship between the duration of the first annealing step and the threading dislocation density is illustrated in FIG. 1. As illustrated in FIG. 1, the duration of the 675° C. anneal was over five hours before the threading dislocation density was reduced below $10^3$/cm$^2$.

The effect of the temperature of the first annealing step on the density of the threading dislocation (at a substrate depth within about one micron from the substrate surface) was also observed for the various substrates. The substrates were implanted with boron using the above-described conditions. The duration of the first step of the anneal was 30 minutes. The duration of the second step of the anneal was also 30 minutes. The first step of the anneal was performed at temperatures of 425° C. to 825° C. The second step of the anneal was performed at 900° C. Some samples were annealed using a single anneal step at 900° C. for 30 minutes. All anneals were performed in a nitrogen atmosphere. The measured density of the threading dislocations after one-step and two-step anneals is reported in Table 1 below.

As previously noted, the depth at which the dislocations were measured for the data in FIG. 1 and Table 1 was about 0.8 $\mu$M. This is considerably greater than the depth of the active areas of devices made using the process of the present invention. However, the dislocation density measurements reported in FIG. 1 and in Table 1 can be extrapolated to determine the dislocation density at another (shallower) depth in the substrate. For example, if the depth of the active areas of the device is about 0.5 $\mu$m or less, one can deduce what conditions reported in Table 1 would provide a device with a dislocation density of less than about $1 \times 10^3/\text{cm}^2$ at a depth in the substrate of about 0.5 $\mu$m or less. Specifically, for the Cz and low-O Cz substrates subjected to a first anneal at a temperature in the range of about 725° C. to about 775° C. the reported threading dislocation density in Table 1

TABLE 1

| Anneal Conditions | Threading Dislocation Density (cm$^{-2}$) | | | |
|---|---|---|---|---|
| | Cz | low oxygen Cz | FZ | Epi |
| 900° C. | $(6.9 \pm 1.5) \times 10^5$ | $(7.3 \pm 2.1) \times 10^5$ | $(1.5 \pm 0.3) \times 10^6$ | $(1.4 \pm 0.4) \times 10^6$ |
| 425° C. ± 25° C./ 900° C. | $(7.6 \pm 0.8) \times 10^5$ | $(6.5 \pm 0.1) \times 10^5$ | $(1.8 \pm 0.1) \times 10^6$ | |
| 625° C. ± 25° C./ 900° C. | $(6.7 \pm 0.8) \times 10^5$ | $(4.9 \pm 0.5) \times 10^5$ | $(1.3 \pm 0.1) \times 10^6$ | $(1.4 \pm 0.1) \times 10^6$ |
| 675° C. ± 25° C./ 900° C. | $(4.6 \pm 0.7) \times 10^5$ | $(4.3 \pm 1.1) \times 10^5$ | $(1.4 \pm 0.1) \times 10^6$ | $(1.1 \pm 0.1) \times 10^6$ |
| 725° C. ± 25° C./ 900° C. | $(6.7 \pm 0.8) \times 10^3$ | $(5.8 \pm 0.8) \times 10^3$ | $(1.4 \pm 0.2) \times 10^6$ | $(8.2 \pm 0.3) \times 10^5$ |
| 775° C. ± 25° C./ 900° C. | $(3.1 \pm 0.3) \times 10^3$ | $(1.7 \pm 0.3) \times 10^3$ | $(3.2 \pm 0.2) \times 10^6$ | $(1.35 \pm 0.03) \times 10^6$ |
| 825° C. ± 25° C./ 900° C. | $(2.1 \pm 0.1) \times 10^6$ | $(1.7 \pm 0.1) \times 10^6$ | $(3.05 \pm 0.01) \times 10^6$ | $(2.38 \pm 0.04) \times 10^6$ |

Referring to Table 1, the threading dislocation density in the FZ and epi substrates was not substantially reduced as the temperature of the first anneal step was increased. However, there was a marked reduction in the threading dislocation density of the Cz and low-O Cz substrates when the temperature of the first anneal was in the range of about 725° C. to about 775° C. The threading dislocation densities in the Cz and low-O Cz substrates subjected to the one-step anneal at 900° C. was substantially higher than the threading dislocation densities in comparable substrates annealed according to the two-step process of the present invention.

The dislocation densities reported in Table 1 were measured at a depth (0.8 $\mu$m) greater than the depth of the active areas of 0.5 $\mu$m and smaller devices. Thus, the measured dislocation densities in Table 1 are greater than the dislocation densities in those same substrates at a depth of 0.5 $\mu$m and less. Table 1 establishes that threading dislocations are reduced by the process of the present invention compared to previously used process conditions. Table 1 also establishes that, based on the threading dislocation density measured at a depth of 0.8 $\mu$m in the substrate, the threading dislocations at a depth of 0.5 $\mu$m or less in the substrate are less than $1 \times 10^3$ atoms/cm$^2$ when the process of the present invention is used.

(measured at a depth of 0.8 $\mu$m in the substrate) establish that the threading dislocations densities at a depth of 0.5 $\mu$m or less in these substrates is less than about $1 \times 10^3/\text{cm}^2$.

What is claimed is:

1. A process for device fabrication comprising:
   implanting a boron dopant into a Czochralski (Cz) silicon substrate wherein the implant energy is in the range of about 500 keV to about 3 MeV and the implant dose is about $1 \times 10^{13}$ atoms/cm$^2$ to about $5 \times 10^{14}$ atoms/cm$^2$;
   annealing the implanted substrate at a first temperature followed by a second temperature to distribute the dopant in the substrate wherein the first temperature is about 725° C. to about 800° C. and the second temperature is at least about 900° C. and wherein the duration of the anneal at the first temperature is less than about thirty minutes and wherein the duration and temperature of the anneal at the first temperature is selected so that a threading dislocation density in the substrate is less than about $10^3/\text{cm}^2$ at a depth in the substrate of at least about 0.5 $\mu$m.

2. The process of claim 1 wherein the first temperature is in the range of about 725° C. to about 775° C.

3. The process of claim 1 wherein the dose is about $3 \times 10^{13}$ atoms /cm$^2$ to about $3 \times 10^{14}$ atoms /cm$^2$.

4. The process of claim 1 wherein the threading dislocation density of less than about $10^3/\text{cm}^2$ is at a depth in the substrate of at least about 0.3 $\mu$m.

* * * * *